(12) United States Patent
Miska

(10) Patent No.: US 6,465,731 B1
(45) Date of Patent: Oct. 15, 2002

(54) THROUGH CONDUCTIVE EMI SHIELDING GASKET

(75) Inventor: Stanley R. Miska, Pittsford, NY (US)

(73) Assignee: Schlegel Systems, Inc., Rochester, NY (US)

( * ) Notice: Subject to any disclaimer, the term of this patent is extended or adjusted under 35 U.S.C. 154(b) by 0 days.

(21) Appl. No.: 09/636,255

(22) Filed: Aug. 10, 2000

(51) Int. Cl.$^7$ .................................................. H05K 9/00
(52) U.S. Cl. .................. 174/35 GC; 277/920; 277/939; 277/944
(58) Field of Search ...................... 174/35 GC; 361/816, 361/818; 277/920, 939, 944

(56) References Cited

U.S. PATENT DOCUMENTS 5,712,449 A * 1/1998 Miska et al. ........... 174/35 GC
5,889,229 A * 3/1999 Sosnowski ............. 174/35 GC

* cited by examiner

Primary Examiner—Anthony Dinkins
Assistant Examiner—Hung V Ngo
(74) Attorney, Agent, or Firm—Stephen B. Salai, Esq.; Brian B. Shaw, Esq.; Harter, Secrest & Emery LLP

(57) ABSTRACT

A gasket for electrical apparatus and the like, operation of which tends to generate or be adversely affected by electromagnetic and radio frequency interference (EMI/RFI), comprising a compressible, electrically conductive core. It may also comprise a flexible, electrically conductive, and substantially abrasion resistant sheath surrounding the compressible core. The apparatus may be sealed against EMI/RFI leakage, noise emission and environmental infiltration and the like.

11 Claims, 1 Drawing Sheet

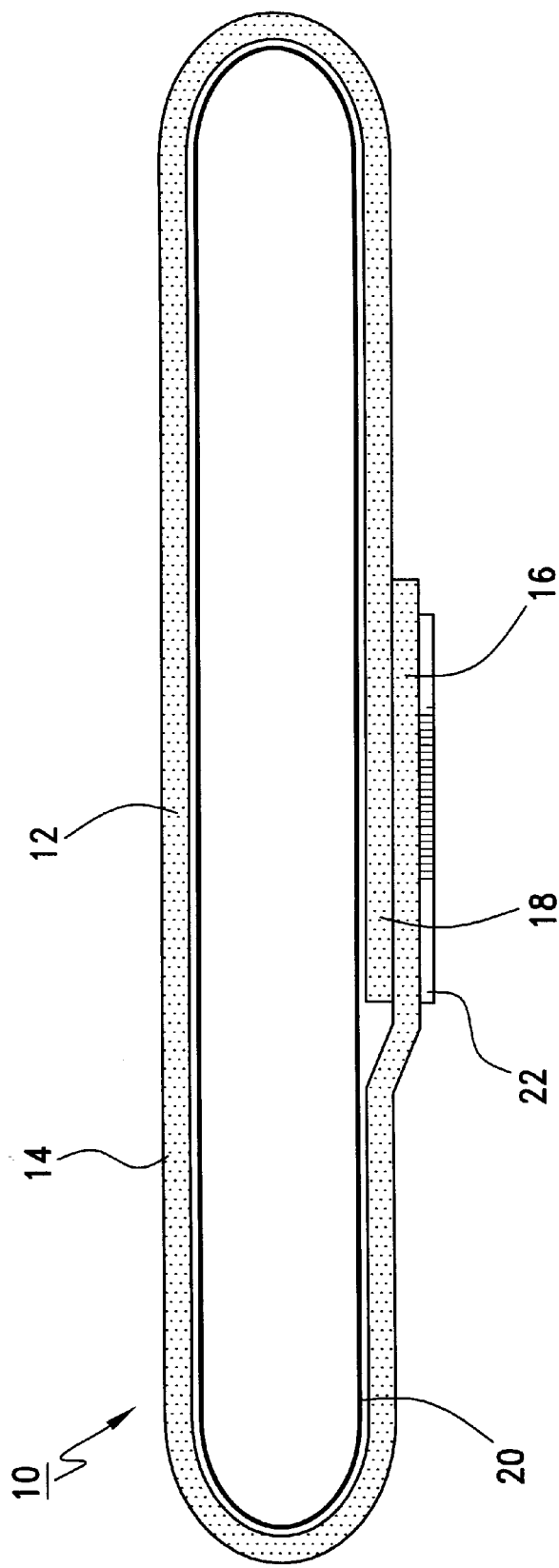
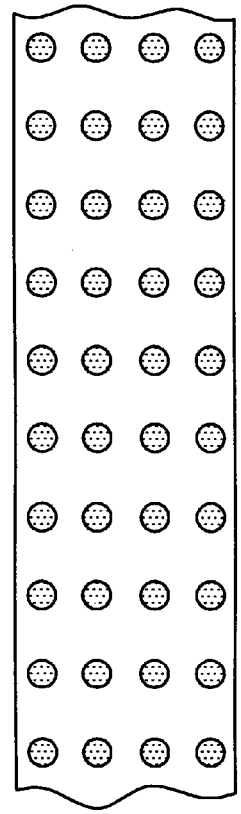
FIG. 1
FIG. 2

THROUGH CONDUCTIVE EMI SHIELDING GASKET

FIELD OF THE INVENTION

This invention relates to the field of seals and gaskets for blocking gaps between conductive structures against passage of electromagnetic interference (EMI), while also sealing the gap environmentally against airflow, noise, dust or the like. Specifically, this invention relates to a new gasket that has a conductive compressible core.

BACKGROUND OF THE INVENTION

Electromagnetic interference (EMI) has been defined as undesired conducted or radiated electrical disturbances from an electrical or electronic apparatus, including transients, which can interfere with the operation of other electrical or electronic apparatus. Such disturbances can occur anywhere in the electromagnetic spectrum. Radio frequency interference (RFI) is often used interchangeably with electromagnetic interference, although it is more properly restricted to the radio frequency portion of the electromagnetic spectrum, usually defined as between 10 kilohertz (KHz) and 10 gigahertz (GHz). Comprehensive technical summaries are available from a number of sources.

A shield is defined as a metallic or otherwise electrically conductive configuration inserted between a source of EMI/RFI and a desired area of protection, which has the capability of absorbing and/or reflecting EMI/RFI and reducing the energy levels thereof. As a practical matter, such shields normally take the form of an electrically conductive housing that is electrically grounded. The energy of the EMI/RFI is thereby dissipated harmlessly to ground. Such a shield may be provided to prevent EMI/RFI radiating from a source or to prevent EMI/RFI (generated randomly or by design) from reaching a target, or both. Most such housings necessarily have access panels, hatches, doors and/or removable covers.

The gaps between the panels, hatches, etc., and the housing provide an undesired opportunity for EMI/RFI to pass through the shield. The gaps also interfere with electrical currents running along the surfaces of the housings from EMI/RFI energy which is absorbed and is being conducted to ground. The gaps reduce the efficiency of the ground conduction path and may even result in the shield becoming a secondary source of EMI/RFI leakage, from gaps that act as slot antennas.

Various configurations of gaskets have been developed over the years to close the gaps of such shields and to effect the least possible disturbance of the ground conduction currents. Each seeks to establish as continuous an electrically conductive path as possible across the gap(s). However, there are inevitable compromises between (1) the ability of the gasket to smoothly and thoroughly engage and conform to the surface of the housing adjacent the gaps, (2) the conductive capacity of the gasket, (3) the ease of mounting the gasket, (4) the ability of the gasket to withstand abrasive wear and tear, as well as repeated compression and relaxation, and (5) the cost of manufacturing the gasket.

The following patents are illustrative of the kinds of gaskets that have been proposed to prevent EMI/RFI leakage.

An RFI shielding gasket disclosed in U.S. Pat. No. 3,555,168 is formed as a conductive foil lamina bonded to a resilient foam backing by a flexible adhesive and is mounted by a pressure-sensitive adhesive on the back of the foam backing. The gasket is a flat member produced from flat layers of flat stock, rather than by extrusion or molding. In a preferred embodiment, the foam is a closed cell, medium density neoprene foam from 0.015 to 0.500 inches thick. The resulting laminate is die cut to shape, and is said to be RFI tight and dust tight. A seal disclosed in U.S. Pat. No. 3,312,769 has a resilient core, preferably neoprene sponge, surrounded by a metallic mesh, preferably an alloy of nickel and copper such as Monel. There is no indication the core is bonded to the metallic mesh in any fashion.

A sealing gasket disclosed in U.S. Pat. No. 2,477,267 comprises a resilient gasket having a network of electrically conductive wires embedded therein and throughout, the wires having portions exposed on opposite surfaces, of the gasket.

A seal disclosed in U.S. Pat. No. 3,466,906 comprises a body of resilient plastic foam material having a plurality of interconnected open cells and a coating of electrically conductive material provided throughout the body on the surfaces of the plastic elements. A conductive coating is preferably applied by electroplating to form a conductive surface on the seal. The seal is available as resilient, single and dual, all-metal strips or compressed shapes. The seal is also available with an elastomer core, in round or rectangular profiles, the core being solid or hollow.

Another gasket is disclosed in Buonanno, U.S. Pat. No. 4,857,668. The sheath is bonded to the foam core as an integral part of a continuous molding process in which the foam is blown or expanded within the sheath. As the foam cures, a sealed outer boundary layer forms on the surface thereof which faces the inner surface of the sheath. The outer boundary layer is stated to have an adhesive character that effects a strong bond between the foam core and the sheath. An adhesive strip may be attached at the overlapped edges at the outer edge thereof for mounting the gasket to a substrate.

One feature of prior art gaskets is that an electrical current had to traverse a path along an outer conductive sheath. To maintain a short electrical path a manufacturer would wrap the non-conductive foam core with an adhesive backed conductive film or fabric. This wrapped material was then die cut or laser cut to allow electronic connectors to pass through the gasket. The cut outs for the electrical connectors that are closer to the center of the gasket have a longer electrical path to follow than those closer to the edge. Thus, the shielding is less effective for these connections. To shorten this electrical path conductive films or fabrics were taped around the cutouts. This method was costly because manufacturers were unable to automate the process.

SUMMARY OF THE INVENTION

An object of the invention was to develop a compressible gasket that would prevent EMI and RFI and also had volume conductivity while maintaining the shortest electrical path across the gasket.

This and other objects of the invention are accomplished by a gasket for shields housing electrical apparatus and the like, operation of which tends to generate or be affected by, EMI/RFI, comprising: a conductive, compressible core, an electrically conductive sheath, and means for mounting the gasket.

The core may be made from polyester, nylon, Basofil, or other material that can be plated with metal or other conductive mediums.

Another embodiment comprises a sheath. The sheath is preferably a flexible, electrically conductive and substantially abrasion resistant sheath surrounding the core and bonded core. The shield may be sealed against EMI/RFI leakage, audible noise emission and environmental infiltration through perimeter gaps of electrically conductive doors, access panels and the like by the actions and interactions of the sheath, the core and the boundary layer. The flexible sheath is continuously pressed into positive and thorough contact with the conductive surfaces, between which it is mounted, by the resilient compressible core, forming a continuous electrical path across the gaps and preventing EM/RFI leakage through the gaps.

The sheath is preferably a fabric, formed at least in part from electrically conductive fibers, or coated with an electrically conductive layer, or both. The metal surface, formed for example by electroless plating or sputtering, is not only highly resistant to damage from abrasion and the like, but is characterized by a relatively low coefficient of friction which enables the gasket to withstand sliding frictional contact. This provides an opportunity to mount the gasket in positions that are not appropriate for gaskets unable to withstand the rigors of sliding contact.

These and other objects and advantages of the invention will become apparent to those skilled in the art from the following detailed description of the preferred embodiments of the invention, shown in the accompanying drawings.

BRIEF DESCRIPTION OF THE DRAWINGS

FIG. 1 is a cross-sectional view of the gasket of the present invention.

FIG. 2 is a top down view of a section of the core with the adhesive applied.

DETAILED DESCRIPTION OF THE PREFERRED EMBODIMENT

The simplest embodiment of a gasket according to this invention is shown in FIG. 1 and generally designated by reference numeral 10. The gasket comprises a conductive compressible core 12 embedded with conductive fibers. The gasket is for shields housing electrical apparatus and the like, operation of which tends to generate or be affected by, EMI/RFI.

The nonconductive compressible core of prior art gaskets is replaced with a conductive compressible material. Various materials can be chosen depending on the temperature range required for a particular application. The gasket of the present invention was designed for applications where high temperatures are generated. In the preferred embodiment, the compressible core is replaced with high temperature felt that is metal plated. Examples include Basofil™, made by BASF, and Nomex® produced by DuPont. The felt is impregnated with metal plated fibers—each fiber being individually plated. These materials are resilient and compliant over a wide range of temperatures. Other alternative materials include polyester and nylon. A metal plated foam core may also be used. A conductive core means that an outer conductive sheath is no longer required for this type of gasket.

If so desired, the gasket may still have conductive material 14 surrounding the core. The material may be applied to one or both sides of the compressive, conductive material. It is bonded to the core with an adhesive. In order to maintain the conductivity of the gasket, the adhesive is applied intermittently. A dot matrix pattern was used for the present invention as illustrated in FIG. 2. However, many intermittent placement patterns for the adhesive exist that would work just as well.

The sheath may comprise conductive film, metal foil, or conductive fabric.

There are different types of conductive fabric. The fabric may be conductive by reason of being formed directly from electrically conductive fibers or by reason of later treatment of the fabric by coating, or otherwise, with an electrically conductive material. The fabric may of course also be formed from a combination of electrically conductive fibers and after-treatment with an electrically conductive material. Examples of fabrics formed by weaving, braiding or knitting fabrics from conductive fibers are described in U.S. Pat. No. 4,684,762, the teachings of which are incorporated by reference.

Another example is silver-coated fabric, woven first from 100% ripstop nylon and then made electrically conductive through a scouring and electroless plating process. The conductive material may also be applied by sputtering. This fabric material has been available in the market place for a number years and is commonly made in both 30 denier (a unit expressing the fineness of silk, rayon, nylon and other yarns as a function of weight in grams per length; lower denier numbers indicating finer yarn) and 100 denier material. The specific processes by which these kinds of fabrics are made do not form part of this invention, and accordingly, are not described in detail herein.

Adhesion of the sheath is promoted by reason of the surface roughness of the fabric, to which the compressible strip or coating strongly adheres. The compressible strip and coating are preferably compatible with regard to adhering to one another. A flame-retardant organic layer or coating 20, preferably urethane, is presently preferred. The layer 20 is also useful for bonding the overlapped edges 16 and 18 of the sheath to one another. Flame retardant urethane formulations are available commercially. An adhesive strip 22 may also be attached at the overlapped edges 16, 18.

Another embodiment may comprise multiple layers of the conductive core material itself. Layers may be laminated together to form a thicker gasket. Each conductive "core" would be bonded with another core. Again an intermittent pattern of adhesive would hold the two layers together. A third layer could be bonded to either of the first two in the same manner.

The invention may be embodied in other specific forms without departing from the spirit or essential attributes thereof. Accordingly, reference should be made to the appended claims, rather than to the foregoing specification, as indicating the scope of the invention.

What is claimed:

1. A conductive EMI shielding gasket comprising:
   (a) a core formed of a compressible conductive material;
   (b) a conductive layer extending over a surface of the core, the conductive layer being selected from the group consisting of conductive film, metal foil and conductive fabric;
   (c) a non conductive adhesive disposed between the surface of the core and the conductive layer for bonding the conductive layer to the core; and
   (d) the adhesive being disposed in an intermittent, discontinuous pattern over the surface of the core so as to maintain the conductivity of the gasket.

2. A conductive EMI shielding gasket comprising:
   (a) a core formed of a compressible conductive material;
   (b) a conductive layer extending over a surface of the core;
   (c) a non conductive adhesive disposed between the surface of the core and the conductive layer in an intermittent, discontinuous dot pattern for bonding the conductive layer to the core in a manner to maintain the conductivity of the gasket.

3. A through conductive EMI shielding gasket, comprising:
(a) a conductive compressible core;
(b) a flexible, electrically conductive sheath surrounding the core; and
(c) a non conductive adhesive bonding the sheath to the core, the adhesive being disposed in a dot matrix pattern.

4. The gasket of claim 3, wherein the core comprises polyester.

5. The gasket of claim 3, wherein the core comprises nylon.

6. The gasket of claim 3 wherein the core comprises felt.

7. The gasket of claim 6, wherein the core is compressible.

8. The gasket of claim 6, wherein the core further comprises metal plated fibers.

9. The gasket of claim 8, wherein the sheath comprises a fabric material.

10. The gasket of claim 8, wherein the sheath comprises a conductive film.

11. The gasket of claim 8, wherein the sheath comprises metal foil.

* * * * *